US010712668B2

(12) United States Patent
Chen et al.

(10) Patent No.: US 10,712,668 B2
(45) Date of Patent: Jul. 14, 2020

(54) SHUTTER DEVICE USED FOR EXPOSURE IN LITHOGRAPHY MACHINE, AND METHOD FOR USE THEREOF

(71) Applicant: SHANGHAI MICRO ELECTRONICS EQUIPMENT (GROUP) CO., LTD., Shanghai (CN)

(72) Inventors: Menglai Chen, Shanghai (CN); Fuping Zhang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/090,055

(22) PCT Filed: Mar. 31, 2017

(86) PCT No.: PCT/CN2017/078936
§ 371 (c)(1),
(2) Date: Sep. 28, 2018

(87) PCT Pub. No.: WO2017/167259
PCT Pub. Date: Oct. 5, 2017

(65) Prior Publication Data
US 2019/0369501 A1 Dec. 5, 2019

(30) Foreign Application Priority Data
Mar. 31, 2016 (CN) .......................... 2016 1 0200735

(51) Int. Cl.
*G03F 7/20* (2006.01)
(52) U.S. Cl.
CPC ................ *G03F 7/70191* (2013.01)
(58) Field of Classification Search
CPC ... G03F 7/701; G03F 7/70558; G03F 7/70191
(Continued)

(56) References Cited

U.S. PATENT DOCUMENTS 6,476,905 B1 * 11/2002 Li ..................... G03B 27/72
355/53
7,196,774 B2 * 3/2007 Won ..................... G03F 7/701
355/69
(Continued)

FOREIGN PATENT DOCUMENTS

CN 1673868 A 9/2005
CN 102096325 A 6/2011
(Continued)

*Primary Examiner* — Hung Nguyen
(74) *Attorney, Agent, or Firm* — Muncy, Geissler, Olds & Lowe, P.C.

(57) ABSTRACT

A shutter device for use in exposure by a photolithography machine and a method of using the shutter device are disclosed. The device includes a shutter blade (1); a rotating motor (2) for driving the shutter blade (1) to rotate; a controller in electric connection with the rotating motor (2); and a supporter (3) for supporting the rotating motor (2). The shutter blade (1) includes a rotation center (11) and, disposed in correspondence with the rotation center (11), at least one open portion (12) and at least one shielding portion (13). The rotation center (11) is coupled to the rotating motor (2) which drives the shutter blade (1) to rotate so that the shutter device opening and closure are accomplished to enable and disable exposure. The shielding portion (13) includes a hollow portion (131) which significantly reduces the mass of the shutter blade (1), thereby facilitating the control over the rotation of the shutter blade (1). Under the control of the controller, the opening and closing of the shutter is accomplished during rotation of the shutter blade (1) at a constant speed, while the acceleration and deceleration of the shutter blade (1) take place in the period when the shutter device is in a closed state, which is relatively long and allows a large stroke. This significantly reduces the required torque of the rotating motor (2) and effectively shortens the shutter opening and closing time.

14 Claims, 6 Drawing Sheets

(58) Field of Classification Search
USPC .............................................. 355/53, 67–71
See application file for complete search history.

(56) References Cited

U.S. PATENT DOCUMENTS

| | | |
|---|---|---|
| 2012/0229966 A1 | 9/2012 | Kim |
| 2017/0255106 A1* | 9/2017 | Hatamoto ........... G03F 7/70558 |

FOREIGN PATENT DOCUMENTS

| | | |
|---|---|---|
| CN | 103293864 A | 9/2013 |
| CN | 102707577 B | 11/2013 |
| CN | 103631066 A | 3/2014 |
| CN | 203535380 U | 4/2014 |
| JP | S54149420 A | 11/1979 |
| JP | S60241055 A | 11/1985 |
| JP | S6136719 A | 2/1986 |
| JP | H0267714 A | 3/1990 |
| JP | H04317315 A | 11/1992 |
| JP | 2004240097 A | 8/2004 |
| JP | 2008141016 A | 6/2008 |
| JP | 2015149450 A | 8/2018 |
| TW | 200842485 A | 11/2008 |

* cited by examiner

SHUTTER DEVICE USED FOR EXPOSURE IN LITHOGRAPHY MACHINE, AND METHOD FOR USE THEREOF

TECHNICAL FIELD

The present invention relates to the manufacturing of photolithography equipment and, more particular, to a shutter device for use in exposure by a photolithography machine and a method of using the shutter device.

BACKGROUND

Photolithography is a technique for printing a pattern with features onto the surface of a substrate. A commonly-used substrate is a semiconductor wafer or a glass substrate having a surface coated with a light-sensitive material (e.g., photoresist). During a photolithography process, a wafer is placed on a wafer stage and the pattern is projected onto the surface of the wafer by means of an exposure device incorporated in the photolithography machine.

One of the important metrics for assessing the performance of a photolithography machine is exposure dosage, because the development of the photoresist will be affected at excessively high or low exposure doses. For this reason, exposure dose control accuracy poses a direct impact on the etching accuracy of the photolithography machine.

Exposure systems in existing medium-end and low-end photolithography machines employ high-pressure mercury lamps as their light sources. Such an exposure system utilizes a mechanical shutter disposed in the optical path to enable or disable exposure, and the exposure dose is determined by the exposure time.

Specifically, this operation may involve:

1) stabilizing an output optical power of the high-pressure mercury lamp by preheating or environmental control;

2) calculating the exposure time, opening the shutter to enable exposure and concurrently starting a timer; and 3) upon the expiration of the exposure time, closing the shutter to disable exposure.

In recent years, the output power of mercury lamps has been on a rise. This means that, at the same exposure dose, the time required for the opening and closing of the shutter must be shortened. However, due to the structural limitations of the conventional mechanical shutter, the shutter opening and closing time is already close to the limit, and increasing the power of the shutter simply increases the burden on the control system. Further, frequent overpowered operations may impair the stability of the system.

In order to overcome the above problem, there has been disclosed in the prior art a shutter device for use in an exposure sub-system of a photolithography machine, which can be quickly opened and closed under the action of high-power voice coil motors. However, in order to achieve a shorter shutter opening and closing time, the voice coil motors often have to operate at high power levels. Additionally, the voice coil motors themselves fail to meet the practical needs in terms of reliability and stability. As a result, many problems may arise from the operation of the shutter, which may ultimately affect the stability and performance of the photolithography tool in which the shutter device is employed.

SUMMARY OF THE INVENTION

It is an objective of the present invention to solve the above-described low-reliability and low-stability problems with the prior art by presenting a shutter device for use in exposure by photolithography machine and a method of using the shutter device.

The above objective is attained by the subject matter of the present invention which lies in a shutter device for use in exposure by a photolithography machine, including: a shutter blade; a rotating motor for driving the shutter blade to rotate; a controller in electric connection with the rotating motor; and a supporter for supporting the rotating motor, the shutter blade including a rotation center and, disposed in correspondence with the rotation center, at least one open portion and at least one shielding portion, the rotation center coupled to the rotating motor, the rotating motor driving the shutter blade to rotate so that the shutter device is opened and closed to enable and disable exposure.

Additionally, a coupling block may be disposed between the rotation center of the shutter blade and the rotating motor.

Additionally, a speed reducer may be disposed between the rotating motor and the coupling block.

Additionally, the supporter may be fixedly connected to the speed reducer.

Additionally, the shutter blade may include one open portion and one shielding portion, each of the open portion and the shielding portion having a central angle of 180 degrees.

Additionally, the shutter blade may include two open portions in symmetry with respect to the rotation center and two shielding portions also in symmetry with respect to the rotation center, wherein each of the open and shielding portions has a central angle of 90 degrees.

Additionally, the shutter blade may include three open portions and three shielding portions, which are staggered one another around the rotation center and each have a central angle of 60 degrees.

Additionally, the shielding portion may include an inner hollow portion and an outer shielding portion that is concentric with the inner hollow portion with respect to the rotation center.

Additionally, the hollow portion may be fan-shaped, with the shielding portion may be annular-shaped.

Additionally, during driving, by the rotating motor, of the shutter blade to form an exposure-enabled region and an exposure-disabled region, the motor and/or the shutter blade rotate at a non-zero speed.

The present invention also provides a method of using a shutter device for use in exposure by a photolithography machine, including the steps of:

S1) assembling a shutter blade, a rotating motor, a controller and a supporter, the shutter blade including a rotation center and, disposed in correspondence with the rotation center, at least one open portion and at least one shielding portion; and S2) activating the rotating motor under control of the controller to cause the shutter blade to rotate so that the shutter device is opened and closed to form an exposure-enabled region and an exposure-disabled region.

Additionally, the shielding portion may include an inner hollow portion and an outer shielding portion that is concentric with the inner hollow portion with respect to the rotation center.

Additionally, the hollow portion may be fan-shaped, with the shielding portion may be annular-shaped.

Additionally, in step S2, during forming an exposure-enabled region and an exposure-disabled region, and subsequent to the activation of the rotating motor under the control of the controller, the shutter blade may be caused to experience acceleration-constant speed-deceleration-stillness-acceleration cycles.

Additionally, acceleration and deceleration of the shutter blade are accomplished during a closing stage of the shutter device, while the shutter blade rotates at a constant speed during an opening stage of the shutter device.

Additionally, in step S2, during forming an exposure-enabled region and an exposure-disabled region, and subsequent to the activation of the rotating motor under the control of the controller, the shutter blade may be caused to experience acceleration-constant speed-deceleration-constant speed-acceleration cycles.

Additionally, acceleration and deceleration of the shutter blade may be accomplished during a closing stage of the shutter device, while the shutter blade rotates at a constant speed during an opening stage of the shutter device.

Additionally, a constant speed at which the rotating motor rotates subsequent to the acceleration may be greater than or equal to 10 times a constant speed at which the rotating motor rotates subsequent to the deceleration.

In the shutter device for use in exposure by photolithography machine and the method of using the shutter device, a shutter blade includes a rotation center and, disposed in correspondence with the rotation center, at least one open portion and at least one shielding portion, the rotation center coupled to a rotating motor which drives the shutter blade to rotate so that the shutter is opened and closed to enable and disable exposure. In addition, the shielding portion includes a hollow portion which significantly reduces the mass of the shutter blade, facilitating the control over the rotation of the shutter blade and improving the exposure dose control accuracy. Further, under the control of the controller, the opening and closing of the shutter is accomplished during rotation of the shutter blade at a constant speed, while the acceleration and deceleration of the shutter blade take place in the period when the shutter is in a closed state, which is relatively long and allows a large stroke. This significantly reduces the required torque of the rotating motor. At the same time, as the constant speed of the rotating motor is relatively high, the shutter opening and closing time is effectively shortened, resulting in a further improvement in the exposure dose control accuracy and in the performance of the photolithography machine.

Figure 1:
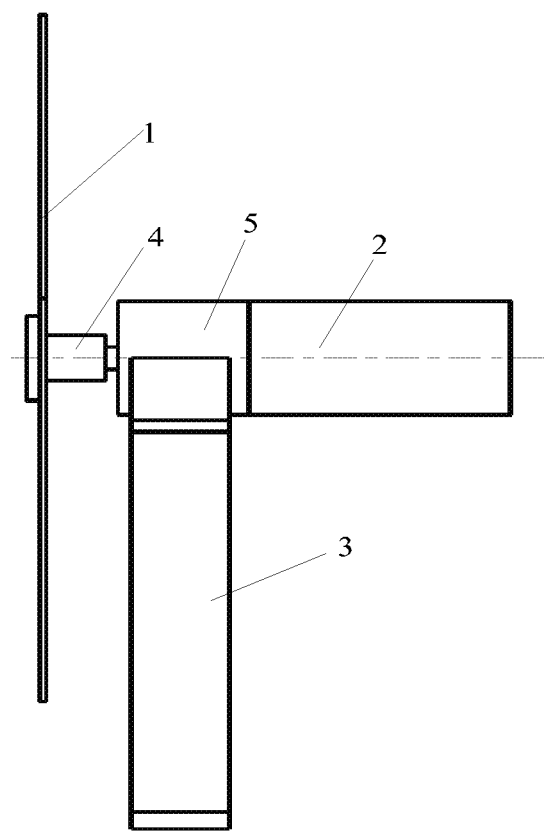
FIG. 1 shows a structural schematic of a shutter device for use in exposure by a photolithography machine constructed in accordance with Embodiment 1 of the present invention.

In these figures, 1—shutter blade; 11—rotation center; 12—open portion; 13—shielding portion; 131—hollow portion; 132—scanning light shielding portion; 2—rotating motor; 3—supporter; 4—coupling block; 5—speed reducer; 6—light beam.

DETAILED DESCRIPTION OF PREFERRED EMBODIMENTS

The present invention will be described below in detail with reference to the accompanying drawings.

Embodiment 1

As shown in FIGS. 1 to 7, the present invention provides a shutter device for used in exposure by a photolithography machine, including: a shutter blade 1; a rotating motor 2 for driving the shutter blade 1 to rotate; a controller (not shown) in electric connection with the rotating motor 2; and a supporter 3 for holding the rotating motor 2. The shutter blade 1 includes a rotation center 11 and at least one open portion 12 and at least one shielding portion 13 which are disposed in correspondence with the rotation center 11. The rotation center 11 is coupled to the rotating motor 2. The rotating motor 2 drives the shutter blade 1 to rotate so that the shutter is opened and closed to enable and disable exposure. In addition, during the enabling and disabling of exposure, the rotating motor 2 and/or shutter blade 1 rotate at a non-zero speed.

With continued reference to FIG. 1, between the rotation center 11 of the shutter blade 1 and the rotating motor 2 may be provided a coupling block 4 configured to effectively fix the rotation center 11 of the shutter blade 1 to an output shaft of the rotating motor 2 to prevent any relative movement between them. In this manner, better control can be achieved over the rotation of the shutter blade 1.

With continued reference to FIG. 1, a speed reducer 5 may be further disposed between the rotating motor 2 and the coupling block 4. Specifically, in this Embodiment, the speed reducer 5 may have a gear ratio of 4:1. The speed reducer 5 may be coupled to the output shaft of the rotating motor 2 so that the speed reducer 5 can provide a trade-off between speed limit and torque limit of the rotating motor 2. As the higher the torque of the rotating motor 2, the greater its power, with the use of the speed reducer 5, the rotating motor 2 is capable of outputting a greater torque without an increase in its power.

Preferably, the supporter 3 is fixedly connected to the speed reducer 5. In particular, the supporter 3 is disposed under the speed reducer 5 so as to support the whole structure of the shutter device.

Figure 2:
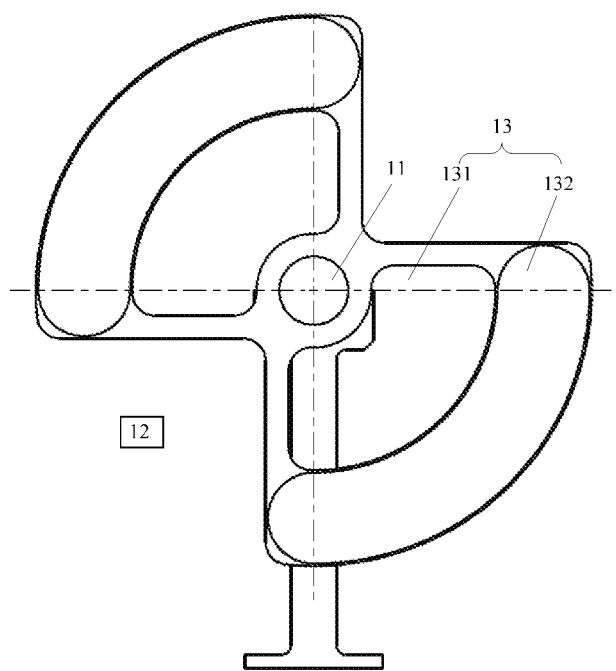
FIG. 2 shows a structural schematic of a shutter blade according to Embodiment 1 of the present invention.

As shown in FIG. 2, the shutter blade 1 may have two open portions 12 in symmetry with respect to the rotation center 11 and two shielding portions 13 also in symmetry with respect to the rotation center 11. Each of the open portions 12 and the shielding portions 13 may have a central angle of 90 degrees.

Preferably, each of the shielding portions 13 may have an inner hollow portion 131 and an outer scanning light shielding portion 132 that is concentric with the inner hollow portion with respect to the rotation center 11. As shown in FIG. 2, the hollow portions 131 may be fan-shaped and can effectively reduce the mass of the shutter blade, which facilitates the control over the rotation of the shutter blade and hence improves the exposure dose control accuracy. The scanning light shielding portions 132 may be annular-shaped which can block the light beam 6 during the rotation of the shutter blade 1 and thus disable exposure.

Figure 3A:
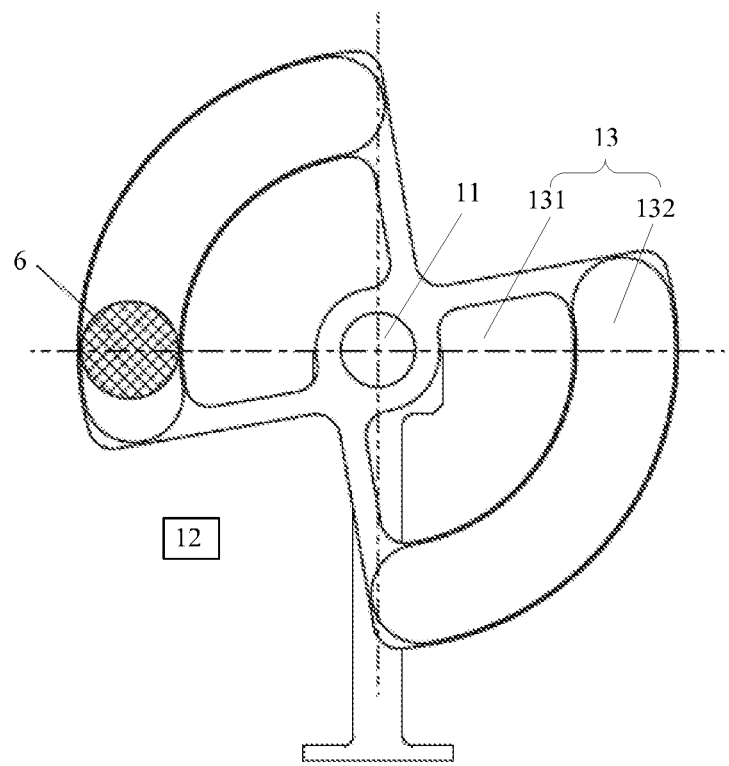
FIGS. 3a to 3b schematically depict a closed state of the shutter according to Embodiment 1 of the present invention.
Figure 3B:
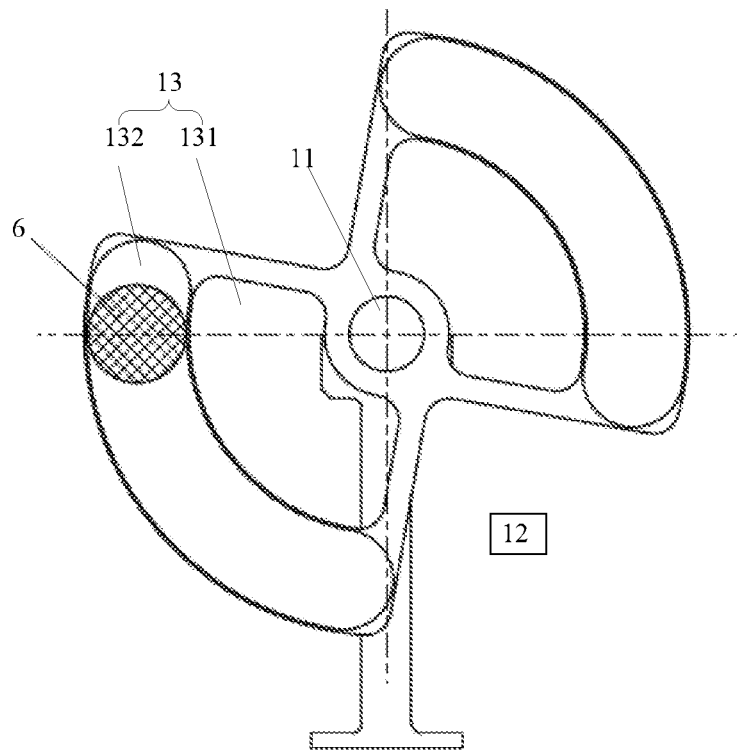
Figure 4A:
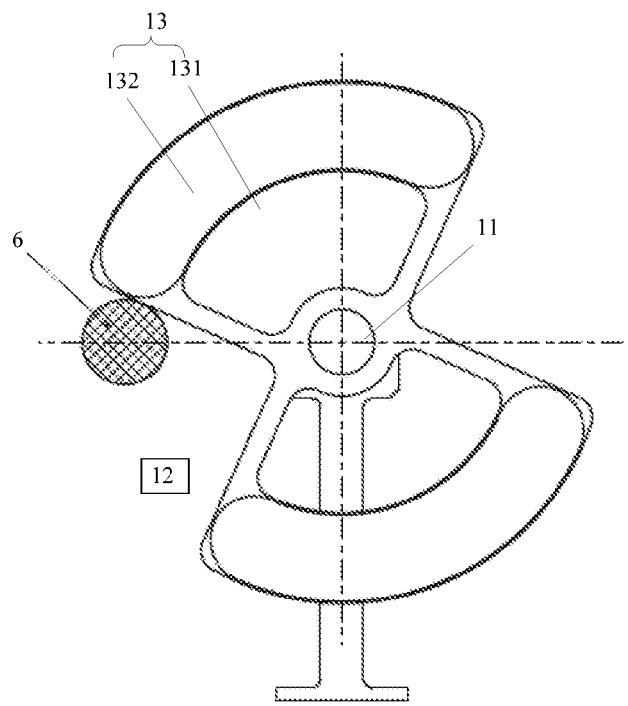
FIGS. 4a to 4b schematically depict a fully-open state of the shutter according to Embodiment 1 of the present invention.
Figure 4B:
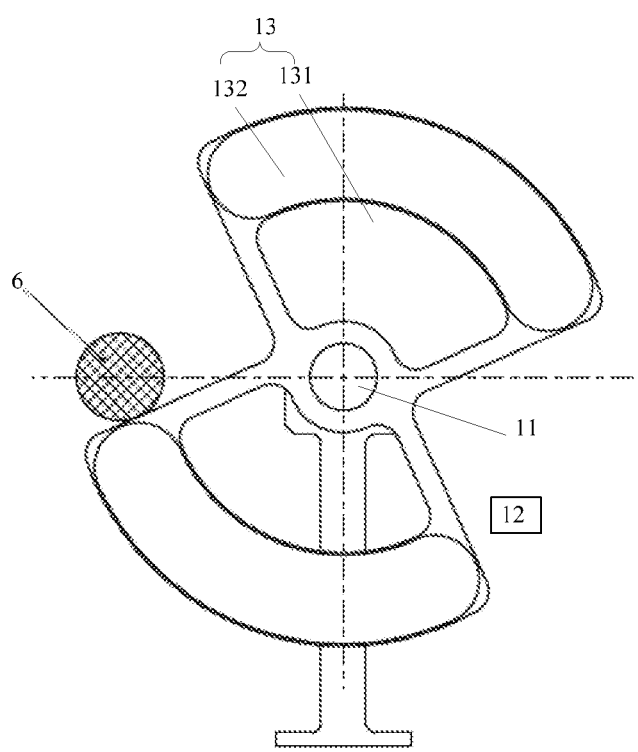
Figure 5A:
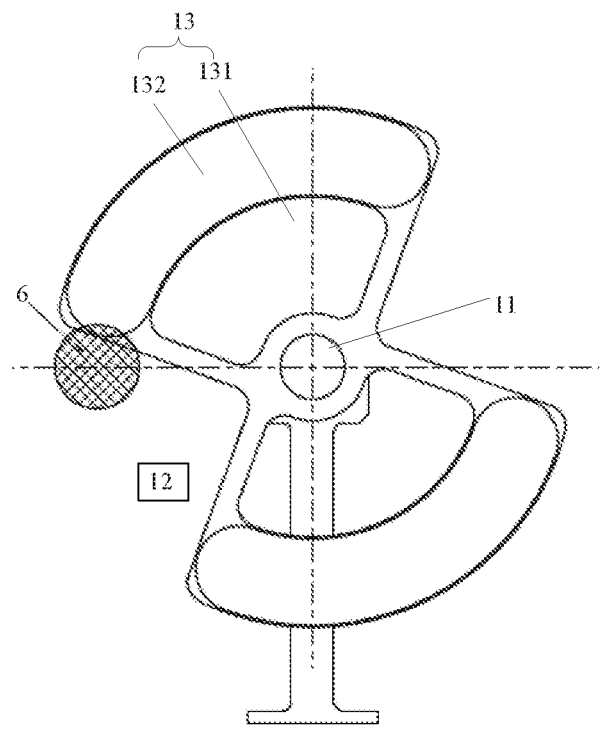
FIGS. 5a to 5b schematically depict a partially-open, partially-closed state of the shutter according to Embodiment 1 of the present invention.
Figure 5B:
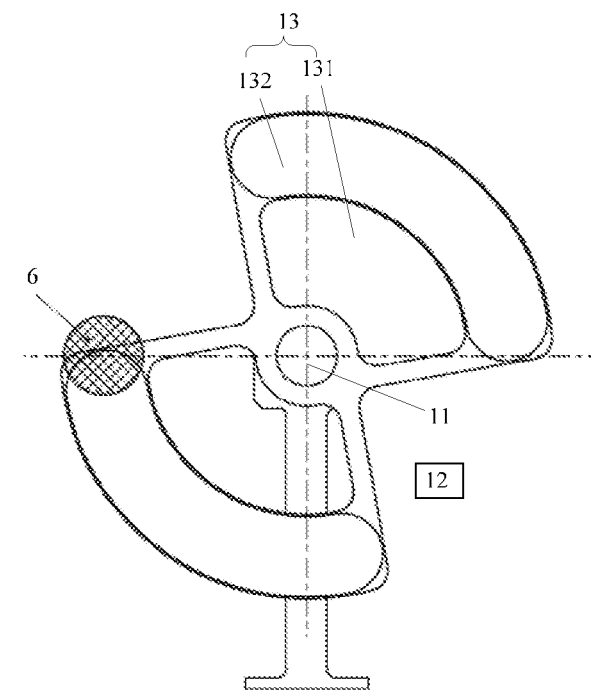

As shown in FIGS. 3a and 3b, when the shielding portion 132 shields the light beam 6, exposure is disabled, which is equivalent to a closed state of the shutter. As shown in FIGS. 4a and 4b, when the light beam 6 is not blocked by the shielding portions 132, i.e., the light beam 6 passes through one of the open portions 12, exposure is allowed, which is equivalent to a fully-open state of the shutter. As shown in FIGS. 5a and 5b, when the light beam 6 partially passes through an open portion 12 and is partially blocked by the shielding portion 132, the shutter is in a partially-open, partially-closed state.

The present invention also provides a method of using a shutter device for use in exposure by a photolithography machine, which include the steps as detailed below.

In S1, a shutter blade 1, a rotating motor 2, a controller and a supporter 3 are assembled. The shutter blade 1 includes a rotation center 11 and, disposed in correspondence with the rotation center 11, at least one open portion 12 and at least one shielding portion 13. The shielding portion 13 may have an inner hollow portion 131 and an outer scanning light shielding portion 132 that is concentric with the inner hollow portion with respect to the rotation center 11. The hollow portion 131 may be fan-shaped and can effectively reduce the mass of the shutter blade, which facilitates the control over the rotation of the shutter blade and hence improves the exposure dose control accuracy.

Figure 6:
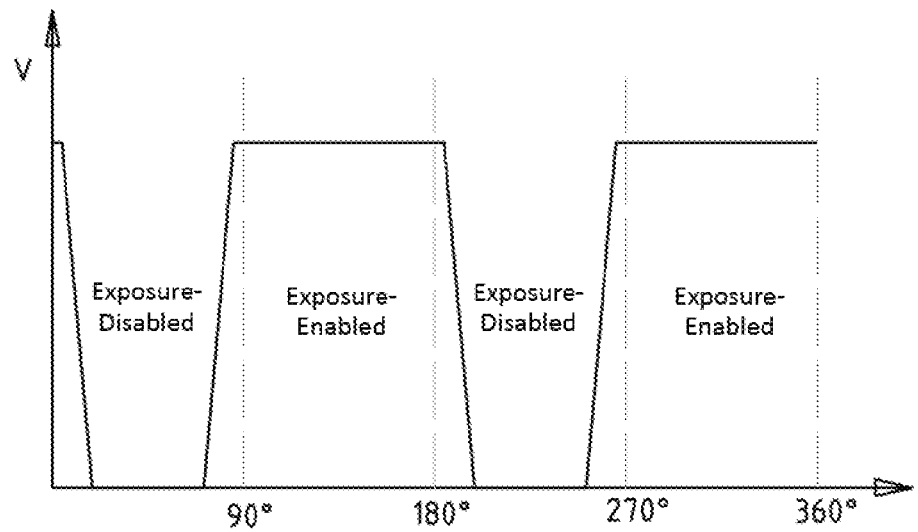
FIG. 6 schematically illustrates rotational speed variation of the shutter blade with a shift among the above shutter states according to Embodiment 1 of the present invention.

In S2, the rotating motor 2 is activated under the control of the controller, causing the shutter blade 1 to rotate, thereby enabling and disabling exposure. Preferably, during the enabling and disabling of the exposure, and subsequent to the activation of the rotating motor 2 under the control of the controller, the shutter blade 1 is caused to experience acceleration-constant speed-deceleration-stillness-acceleration cycles. As shown in FIG. 6, during a closed stage of the shutter, which stage corresponds to an exposure-disabled region in the figure, the acceleration and deceleration of the shutter blade 1 are both accomplished. In addition, during an opening stage of the shutter, which stage corresponds to an exposure-enabled region in the figure, the shutter blade 1 rotates at a constant speed. Specifically, the opening stage of the shutter includes partially-open, partially-closed and fully-open states as shown in FIGS. 3a-5b. Thus, under the control of the controller, the open and closed states of the shutter are configured within the periods during which the shutter blade 1 rotates at a constant speed, while the acceleration and deceleration of the shutter blade 1 take place in the a closing stage of the shutter, which is relatively long and allows a large stroke. This significantly reduces the required torque of the rotating motor 2. At the same time, as the constant speed of the rotating motor 2 is relatively high, the shutter opening and closing time is effectively shortened, resulting in a further improvement in the exposure dose control accuracy and in the performance of the photolithography machine.

Figure 7:
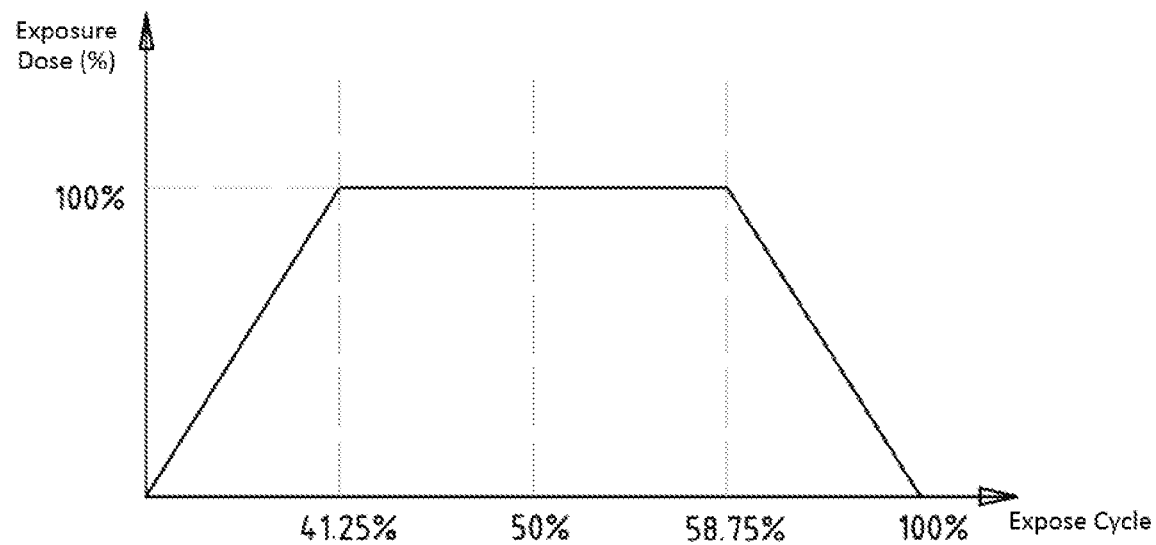
FIG. 7 shows a theoretical exposure dose utilization rate profile in one shutter cycle according to Embodiment 1 of the present invention.

As shown in FIG. 7, during a constant-speed rotation cycle that experiences the partially-open, fully-open and partially-closed states, the shutter blade 1 according to this Embodiment has a theoretical exposure dose utilization rate of 58.75%.

Assuming the incident light has an illuminance G and a desired exposure dose is denoted by K, then the exposure time t is:

$$t = \frac{K}{G \times 58.75\%} \tag{1}$$

Since the speed reducer 5 has a gear ratio of 4:1 and each exposure-disabled period accounts for ¼ of the shutter cycle, the speed P of the rotating motor 2 is:

$$P = \frac{\frac{1}{4} \times 4}{t} = \frac{G \times 58.75\% \times \frac{1}{4} \times 4 \times 60}{K} \text{ rpm} \tag{2}$$

Assuming the incident illuminance G=3000 mW/cm² and a minimum of the desired exposure dose K is 80 mJ in this Embodiment, then:

$$t = \frac{K}{G \times 58.75\%} = 9.789 \text{ ms} \tag{3}$$

and the speed P of the rotating motor 2 is:

$$P = \frac{\frac{1}{4} \times 4}{t} = \frac{G \times 58.75\% \times \frac{1}{4} \times 4 \times 60}{K} = 7661 \text{ rpm} \tag{4}$$

In this Embodiment, within each exposure-disabled period that accounts for ¼ of the shutter cycle, the rotating motor 2 has to decrease its speed to zero and subsequently increase the speed to 7661 rpm at an angular acceleration of:

$$\varepsilon = \frac{V^2}{2 \times \frac{1}{4} \times 3.14} = 25597 \text{ rad}/S^2 \tag{5}$$

where, V represents the linear speed of the rotating motor 2.

On the basis of this, a rotational moment of inertia for the shutter blade 1 in this Embodiment can be obtained as $J=1.2 \times 10^{-5}$ kg/m² and the torque as:

$$T = \frac{1}{4} \times J \times \varepsilon \times 1000 = 76.8 \text{ mNm} \tag{6}$$

Under such a condition, in each exposure-disabled period, the rotating motor 2 needs to operate for 31.3 ms. Based on a required length of the exposure-disabled period, the duration in which the shutter blade 1 does not rotate and stays still can be determined.

Embodiment 2

Figure 8:
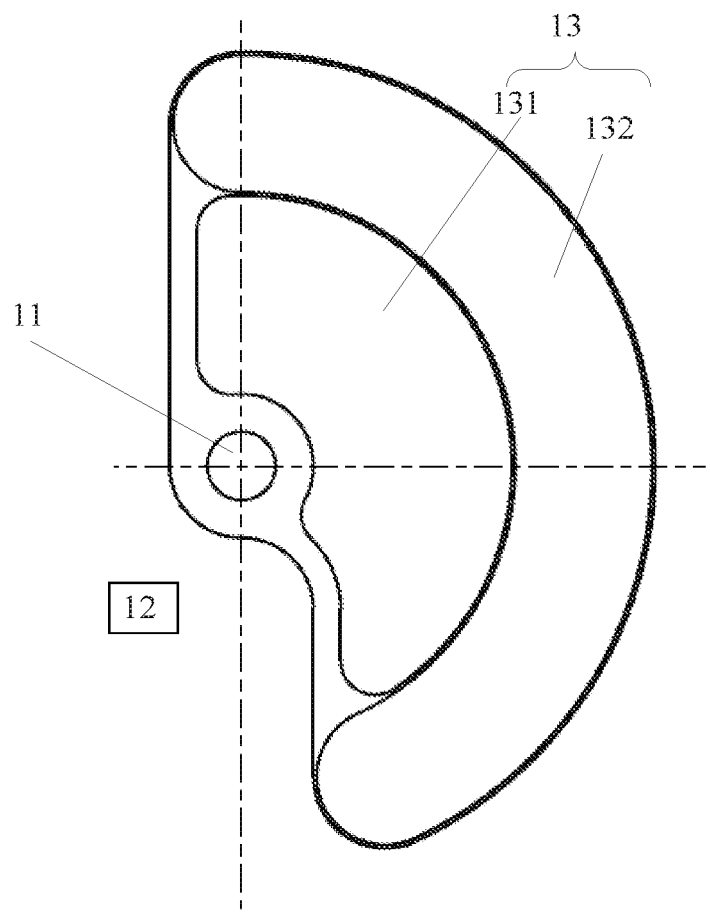
FIG. 8 shows a structural schematic of a shutter blade according to Embodiment 2 of the present invention.

As shown in FIG. 8, this Embodiment differs from Embodiment 1 in that the shutter blade 1 has one open portion 12 and one shielding portion 13. Each of the open portion 12 and the shielding portion 13 has a central angle of 180 degrees. Additionally, the speed reducer 5 is omitted, and the shutter blade 1 is directly driven by the rotating motor 2 instead. Preferably, the shielding portion 13 includes an inner hollow portion 131 and an outer scanning light shielding portion 132 that is concentric with the inner hollow portion with respect to the rotation center 11. The hollow portion 131 may be fan-shaped and can effectively reduce the mass of the shutter blade, which facilitates the control over the rotation of the shutter blade and hence improves the exposure dose control accuracy. The scanning light shielding portion 132 may be annular-shaped which can block light during the rotation of the shutter blade 1 and thus disable exposure. In this Embodiment, as the shutter blade 1 has only one open portion 11 and only one shielding portion 12, the fraction of the period in which the shutter blade 1 is partially-open or partially-closed in the shutter cycle is reduced, improving the exposure dose utilization rate.

During a constant-speed rotation cycle experiencing the partially-open fully-open and partially-closed states, the shutter blade 1 according to this Embodiment has a theoretical exposure dose utilization rate of 86.11%.

Assuming the incident light has an illuminance G and a desired exposure dose is denoted by K, then the exposure time t is:

$$t = \frac{K}{G \times 86.11\%} = 6.68 \text{ ms} \tag{7}$$

Since the exposure-disabled period accounts for ½ of the shutter cycle, the speed P of the rotating motor 2 is:

$$P = \frac{\frac{1}{2}}{t} = \frac{G \times 86.11\% \times \frac{1}{2} \times 60}{K} = 4491 \text{ rpm} \tag{8}$$

Within the exposure-disabled period that accounts for ½ of the shutter cycle, the rotating motor 2 has to decrease its speed to zero and subsequently increase the speed to 4491 rpm at an angular acceleration of:

$$\varepsilon = \frac{V^2}{2 \times 3.14} = 35183 \text{ rad}/S^2 \tag{9}$$

where, V represents the linear speed of the rotating motor 2.

On the basis of this, a rotational moment of inertia for the shutter blade 1 in this Embodiment can be obtained as $J=1\times10^{-5}$ kg/m² and the torque as:

$$T = J \times \varepsilon \times 1000 = 256 \text{ mNm} \tag{10}$$

Under such a condition, in the exposure-disabled period, the rotating motor 2 needs to operate for 26.7 ms. Based on a required length of the exposure-disabled period, the duration in which the shutter blade 1 does not rotate and stays still can be determined.

Embodiment 3

This Embodiment differs from Embodiment 1 in that the shutter blade 1 has three open portions 12 and three shielding portions 13, which are staggered one another around the rotation center 11 and each of the open portions 12 and the shielding portions 13 has a central angle of 60 degrees.

Preferably, each of the shielding portions 13 includes an inner hollow portion 131 and an outer scanning light shielding portion 132 that is concentric with the inner hollow portion with respect to the rotation center 11. The hollow portion 131 may be fan-shaped and can effectively reduce the mass of the shutter blade, which facilitates the control over the rotation of the shutter blade and hence improves the exposure dose control accuracy. The scanning light shielding portion 132 may be annular-shaped which can block light during the rotation of the shutter blade 1 and thus disable exposure.

During a constant-speed rotation cycle experiencing the partially-open fully-open and partially-closed states, the shutter blade 1 according to this Embodiment has a theoretical exposure dose utilization rate of 50%.

Assuming the incident light has an illuminance G and a desired exposure dose is denoted by K, then the exposure time t is:

$$t = \frac{K}{G \times 50\%} = 11.5 \text{ ms} \tag{11}$$

Since the speed reducer 5 has a gear ratio of 4:1 and the exposure-disabled period accounts for ⅙ of the shutter cycle, the speed P of the rotating motor 2 is:

$$P = \frac{\frac{1}{4} \times 4}{t} = \frac{G \times 50\% \times \frac{1}{4} \times 4 \times 60}{K} = 5217 \text{ rpm} \tag{12}$$

Within the exposure-disabled period that accounts for ⅙ of the shutter cycle, the rotating motor has to decrease its speed to zero and subsequently increase the speed to 5217 rpm at an angular acceleration of:

$$\varepsilon = \frac{V^2}{2 \times \frac{1}{6} \times 3.14} = 17805 \text{ rad}/S^2 \tag{13}$$

On the basis of this, a rotational moment of inertia for the shutter blade 1 in this Embodiment can be obtained as $J=1\times10^{-5}$ kg/m² and the torque as:

$$T = \frac{1}{4} \times J \times \varepsilon \times 1000 = 44.5 \text{ mNm} \tag{14}$$

Under such a condition, in the exposure-disabled period, the rotating motor 2 needs to operate for 30 ms. Based on a required length of the exposure-disabled period, the duration in which the shutter blade 1 does not rotate and stays still can be determined.

Embodiment 4

A method of using a shutter device for use in exposure by a photolithography machine in accordance with this Embodiment includes the steps as detailed below.

In S1, a shutter blade 1, a rotating motor 2, a controller and a supporter 3 are assembled. The shutter blade 1 includes a rotation center 11 and, disposed in correspondence with the rotation center 11, at least one open portion 12 and at least one shielding portion 13. The shielding portion 13 may have an inner hollow portion 131 and an outer scanning light shielding portion 132 that is concentric with the inner hollow portion with respect to the rotation center 11. The hollow portion 131 may be fan-shaped and can effectively reduce the mass of the shutter blade 1, which facilitates the control over the rotation of the shutter blade 1 and hence improves the exposure dose control accuracy.

Figure 9:
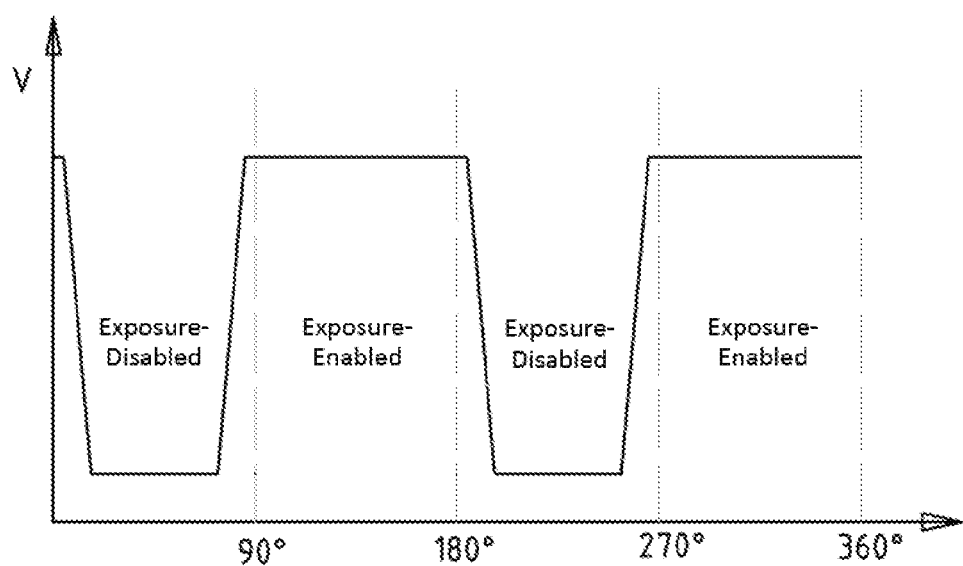
FIG. 9 schematically illustrates rotational speed variation of a shutter blade with a shift among different shutter states according to Embodiment 4 of the present invention.

In S2, the rotating motor 2 is activated under the control of the controller, causing the shutter blade 1 to rotate, thereby enabling and disabling exposure. Preferably, during the enabling and disabling of exposure subsequent to the activation of the rotating motor 2 under the control of the controller, the shutter blade 1 is caused to experience acceleration-constant speed-deceleration-constant speed-acceleration cycles, as shown in FIG. 9. Preferably, in each cycle, the constant speed at which the rotating motor 2 rotates subsequent to the acceleration is greater than or equal to 10 times the constant speed at which the rotating motor 2 rotates subsequent to the deceleration. This rotation speed variation arrangement is suitable for applications in which long exposure periods and short shutter closure periods are required. Due to a short shutter closure period, this scheme requires a high rate of utilization of light source illuminance. In addition, activation of the rotating motor 2 tends to be accompanied with an extremely high current which may lead to greater heat accumulation within the rotating motor 2 and hence structural expansion thereof and may cause the rotating motor 2 to be stuck or to experience a short circuit. In contrast, as the rotating motor 2 that drives the shutter blade 1 is always moving in this Embodiment without being frequently activated, its reliability and service lift are increased.

In summary, in the shutter device for use in exposure by photolithography machine and the method of using the shutter device, a shutter blade 1 includes a rotation center 11 and, disposed in correspondence with the rotation center, at least one open portion 12 and at least one shielding portion 13, the rotation center 11 coupled to a rotating motor 2. The rotating motor 2 drives the shutter blade 1 to rotate so that the shutter is opened and closed to enable and disable exposure. In addition, the shielding portion 13 includes a hollow portion 131 which significantly reduces the mass of the shutter blade 1, facilitating the control over the rotation of the shutter blade 1 and improving the exposure dose control accuracy. Further, under the control of the controller, the opening and closing of the shutter is accomplished during rotation of the shutter blade 1 at a constant speed, while the acceleration and deceleration of the shutter blade 1 take place in the period when the shutter is in a closed state, which is relatively long and allows a large stroke. This significantly reduces the required torque of the rotating motor 2. At the same time, as the constant speed of the rotating motor 2 is relatively high, the shutter opening and closing time is effectively shortened, resulting in a further improvement in the exposure dose control accuracy and in the performance of the photolithography machine.

Although a few embodiments of the present invention have been described herein, these embodiments are merely illustrative and are not intended to be construed as limiting the scope of the invention. Various omissions, substitutions and changes made without departing from the spirit of the invention are all intended to be included within the scope thereof.

What is claimed is:

1. A shutter device for use in exposure by a photolithography machine, comprising: a shutter blade; a rotating motor for driving the shutter blade to rotate; a controller in electric connection with the rotating motor; and a supporter for supporting the rotating motor, the shutter blade comprising at least one open portion, at least one shielding portion and a rotation center of the at least one open portion and the at least one shielding portion, the rotation center coupled to the rotating motor, the rotating motor driving the shutter blade to rotate so that the shutter device is opened and closed to enable and disable exposure, wherein the shielding portion comprises an inner hollow portion and an outer shielding portion that is concentric with the inner hollow portion with respect to the rotation center,
wherein during driving, by the rotating motor, of the shutter blade to form an exposure-enabled region and an exposure-disabled region, the motor and/or the shutter blade rotate at a non-zero speed, and wherein a speed reducer is disposed between the rotation center of the shutter blade and the rotating motor.

2. The shutter device for use in exposure by a photolithography machine of claim 1, wherein a coupling block is disposed between the rotation center of the shutter blade and the rotating motor.

3. The shutter device for use in exposure by a photolithography machine of claim 2, wherein the speed reducer is disposed between the rotating motor and the coupling block.

4. The shutter device for use in exposure by a photolithography machine of claim 3, wherein the supporter is fixedly connected to the speed reducer.

5. The shutter device for use in exposure by a photolithography machine of claim 1, wherein the shutter blade comprises one open portion and one shielding portion, each of the open portion and the shielding portion having a central angle of 180 degrees.

6. The shutter device for use in exposure by a photolithography machine of claim 1, wherein the shutter blade comprises two open portions in symmetry with respect to the rotation center and two shielding portions also in symmetry with respect to the rotation center, and wherein each of the open portions and the shielding portions has a central angle of 90 degrees.

7. The shutter device for use in exposure by a photolithography machine of claim 1, wherein the shutter blade comprises three open portions and three shielding portions, which are staggered one another around the rotation center, and wherein each of the open portions and the shielding portions has a central angle of 60 degrees.

8. The shutter device for use in exposure by a photolithography machine of claim 1, wherein the hollow portion is fan-shaped and the shielding portion is annular-shaped.

9. A method of using a shutter device for use in exposure by a photolithography machine, comprising the steps of:

S1) assembling a shutter blade, a rotating motor, a controller and a supporter, the shutter blade comprising a rotation center and, disposed in correspondence with the rotation center, at least one open portion and at least one shielding portion, wherein a speed reducer is disposed between the rotation center of the shutter blade and the rotating motor; and S2) activating the rotating motor under control of the controller to cause the shutter blade to rotate so that the shutter device is opened and closed to form an exposure-enabled region and an exposure-disabled region, wherein in step S2, during forming an exposure-enabled region and an exposure-disabled region, and subsequent to the activation of the rotating motor under the control of the controller, the shutter blade is caused to experience acceleration-constant speed-decelerationstillness-acceleration cycles, wherein acceleration and deceleration of the shutter blade are accomplished during a closing stage of the shutter device, while the shutter blade rotates at a constant speed during an opening stage of the shutter device.

10. The method of using a shutter device for use in exposure by a photolithography machine of claim 9, wherein the shielding portion comprises an inner hollow portion and an outer shielding portion that is concentric with the inner hollow portion with respect to the rotation center.

11. The method of using a shutter device for use in exposure by a photolithography machine of claim 10, wherein the hollow portion is fan-shaped and the shielding portion is annular-shaped.

12. The method of using a shutter device for use in exposure by a photolithography machine of claim 9, wherein in step S2, during forming an exposure-enabled region and an exposure-disabled region, and subsequent to the activation of the rotating motor under the control of the controller, the shutter blade is caused to experience acceleration-constant speed-deceleration-constant speed-acceleration cycles.

13. The method of using a shutter device for use in exposure by a photolithography machine of claim 12, wherein acceleration and deceleration of the shutter blade are accomplished during a closing stage of the shutter device, while the shutter blade rotates at a constant speed during an opening stage of the shutter device.

14. The method of using a shutter device for use in exposure by a photolithography machine of claim 12, wherein a constant speed at which the rotating motor rotates subsequent to the acceleration is greater than or equal to 10 times a constant speed at which the rotating motor rotates subsequent to the deceleration.

* * * * *